United States Patent [19]

Liu

[11] 4,152,044
[45] May 1, 1979

[54] GALIUM ALUMINUM ARSENIDE GRADED INDEX WAVEGUIDE

[75] Inventor: Yet-Zen Liu, Roanoke, Va.

[73] Assignee: International Telephone and Telegraph Corporation, Nutley, N.J.

[21] Appl. No.: 807,473

[22] Filed: Jun. 17, 1977

[51] Int. Cl.² .......................................... H01L 27/15
[52] U.S. Cl. ............................... 350/96.12; 350/96.11; 357/17; 357/19
[58] Field of Search ............... 350/96.11, 96.12, 96.31, 350/96.34; 357/17, 18, 19

[56] References Cited
U.S. PATENT DOCUMENTS

| | | | |
|---|---|---|---|
| 3,922,062 | 11/1975 | Uchida | 350/96.12 |
| 3,963,468 | 6/1976 | Jaeger et al. | 350/96.12 X |
| 4,015,893 | 4/1977 | Sugano et al. | 350/96.12 |
| 4,021,834 | 5/1977 | Epstein et al. | 350/96.12 X |
| 4,054,363 | 10/1977 | Suematsu | 350/96.11 |
| 4,117,504 | 9/1978 | Maslov et a. | 357/17 X |

OTHER PUBLICATIONS

Reinhart et al., "Monolithically Integrated AlGaAs Double Heterostructure Optical Components," *Applied Physics Letters*, vol. 25, No. 10, Nov. 15, 1974.

*Primary Examiner*—John K. Corbin
*Assistant Examiner*—John D. Lee
*Attorney, Agent, or Firm*—John T. O'Halloran; Peter C. Van Der Sluys; Stephen Goldman

[57] ABSTRACT

A double heterostructure light emitting device has a graded index optical waveguide formed integrally therein. The integrally formed waveguide collects light from the heterojunction and directs the light in a distinct light pattern on one surface of the device. The rate of variation of the index gradient within the waveguide region determines the geometry of the light pattern. The light output pattern can be conveniently tailored to match the geometry of a wide variety of optical fiber dimensions.

20 Claims, 20 Drawing Figures

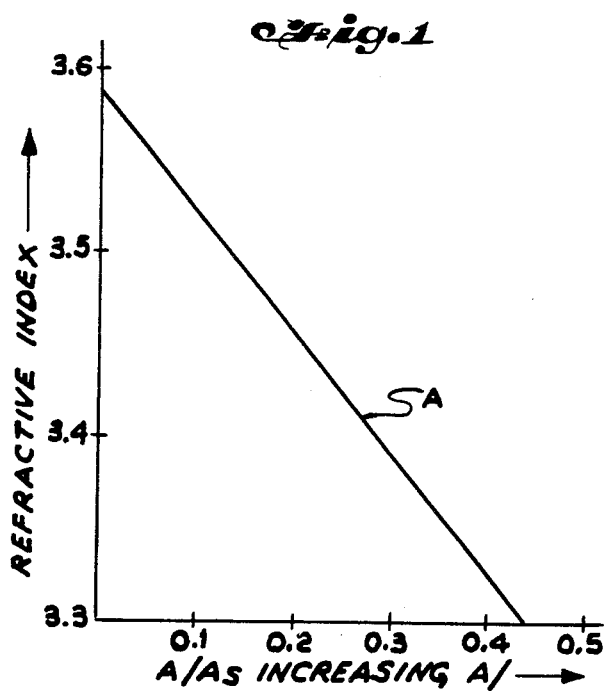
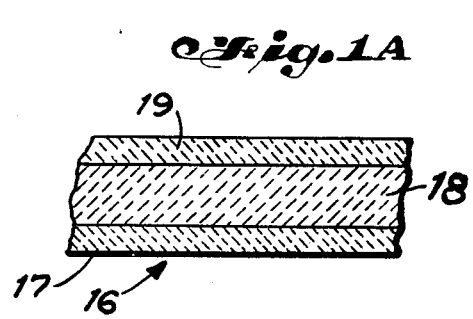
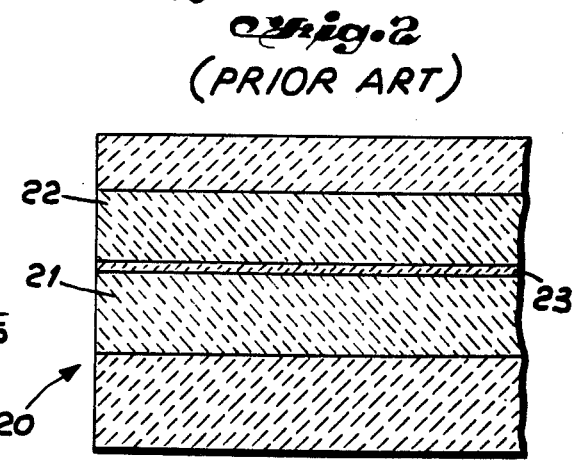
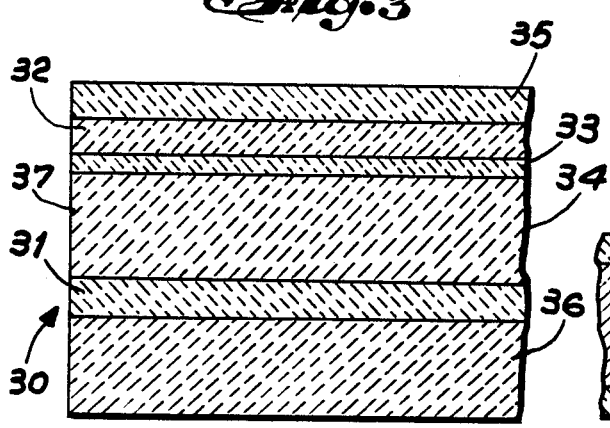
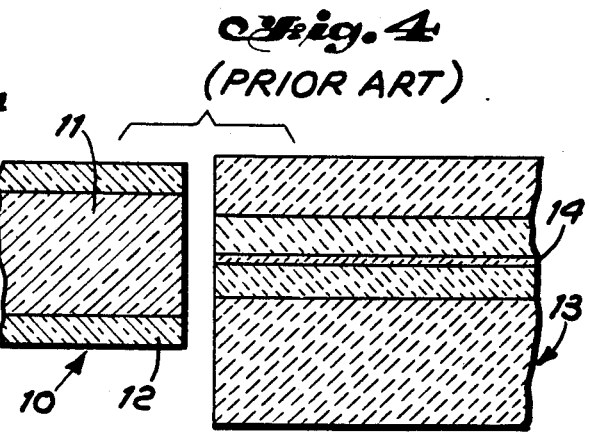
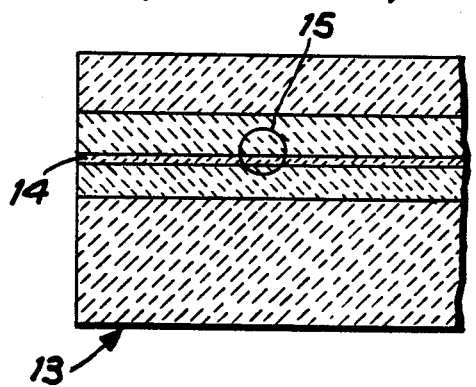
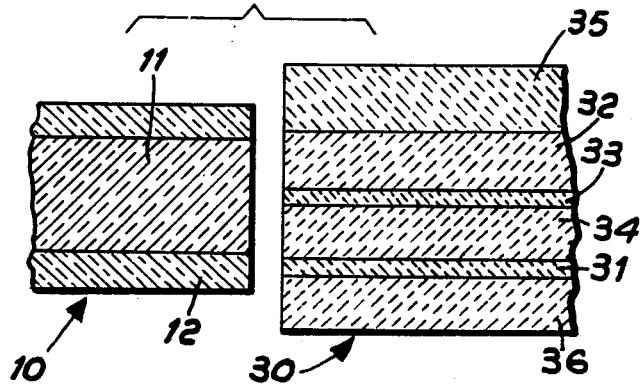

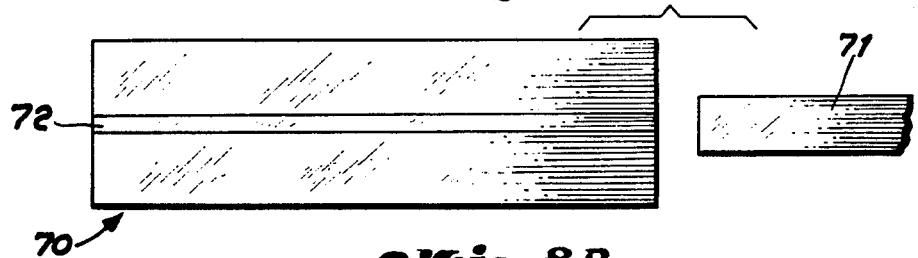
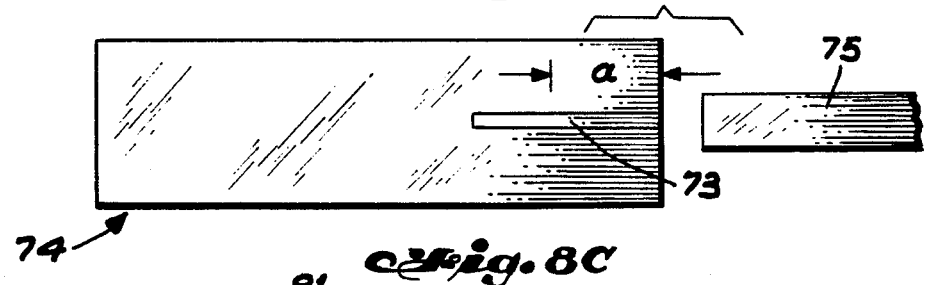
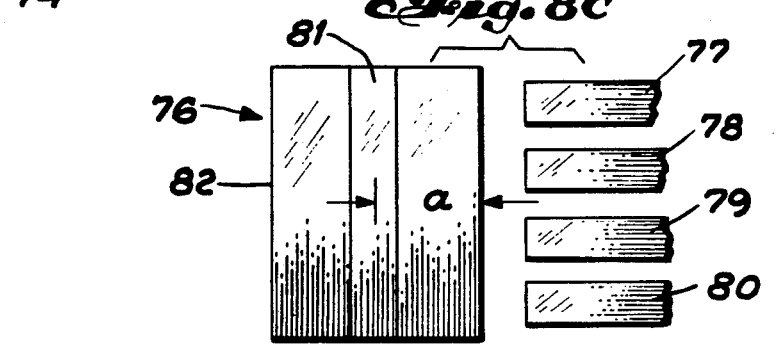
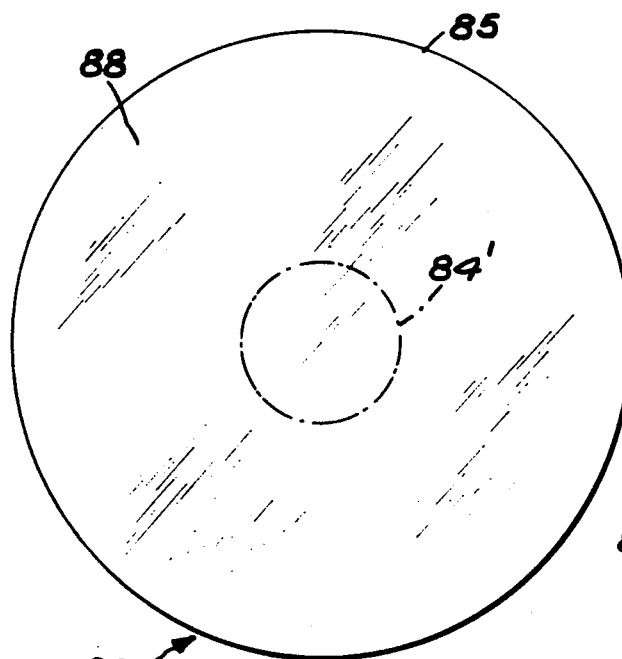
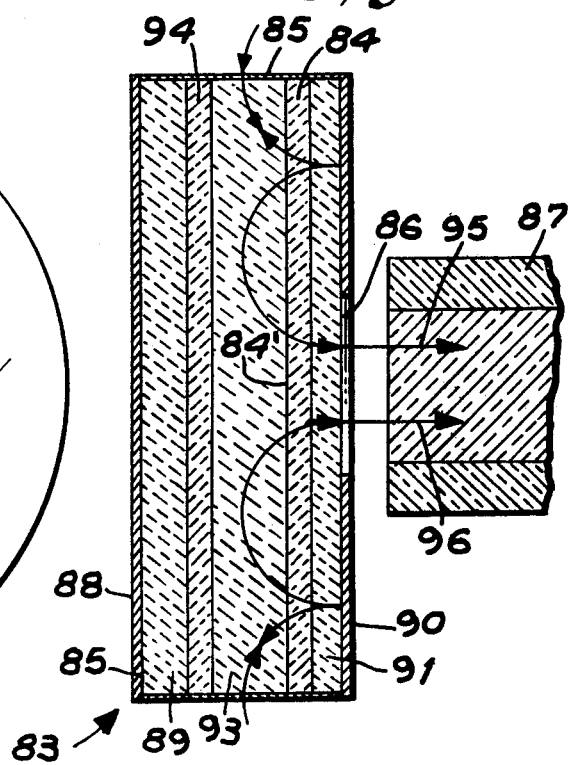

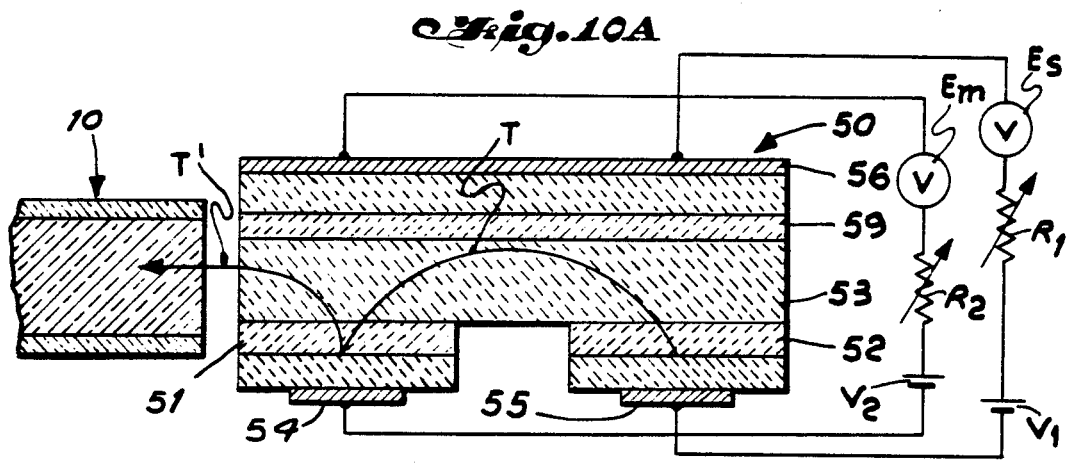
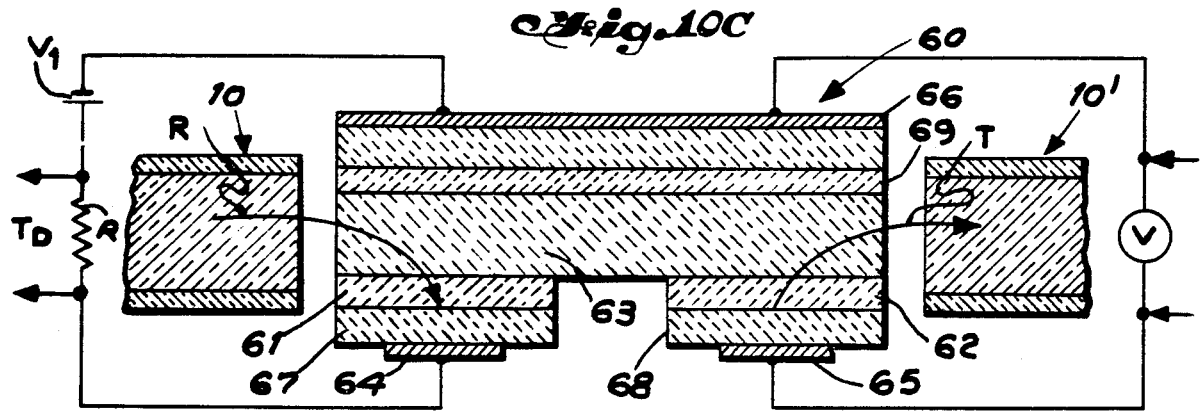
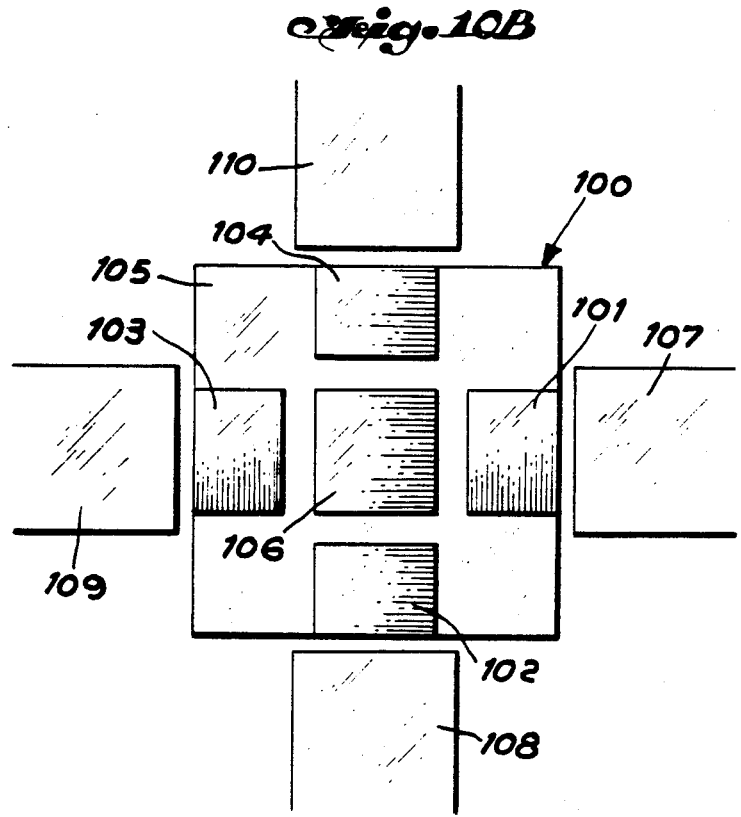

GALIUM ALUMINUM ARSENIDE GRADED INDEX WAVEGUIDE

BACKGROUND OF THE INVENTION

When double heterostructure light emitting devices are used as optical sources in optical communication systems, one of the problems involved is to accurately couple the light from the source into the optical communications fiber. The optical fiber core is generally constructed within specific design specifications for the purpose of mode selection and for reducing the dispersion time existing between the various modes. The diameter of the emitted light spot from the double heterostructure device is generally designed to provide the greatest quantity of light for the amount of electrical energy provided to the p-n junction of the device. One of the problems with existing optical communication systems is the difference in the geometry of the light spot generated by the double heterostructure device and the light carrying core of the optical communication fiber.

One method for compensating between the differential geometry of the optical fiber core and the dimensions of the light emitting spot of the double heterostructure device is to interpose a gradually tapering optical fiber wherein one end of the interposed fiber has a geometry comparable with that of the dimensions of the light emitting spot and the other end of the fiber is comparable with the core of the optical systems fiber.

The purpose of this invention is to provide an integrated optics device wherein the double heterostructure light emitter contains an integral waveguide and wherein the geometry of the light emitting spot and the exit angle of the light are determined by the properties of the waveguide. This now enables the light spot to be better matched to the light receiving core of the optical communication fiber. The integral waveguide can also be used to guide the emitted light around to modulators and switches (etc.) which can be integrated on a common substrate.

SUMMARY OF THE INVENTION

A double heterostructure light emitting device contains a plurality of layers of gallium arsenide and gallium aluminum arsenide wherein the gallium aluminum arsenide layer next to the active light emitting layer contains a graded index of refraction. The region closest to the active layer has a higher index of refraction than the region furthest from the active layer. The graded index of refraction causes the light to periodically focus within the gallium aluminum arsenide layer.

One embodiment of the gallium aluminum arsenide device of this invention uses the concentration of aluminum within the gallium aluminum arsenide layer to cause the index of refraction to decrease inversely with increasing aluminum dopant concentration.

The graded index waveguide layer of this invention provides a light emitting exit angle to suit fibers of different numerical apertures.

The invention further contemplates an integrated optic detection device wherein light entering the device can be caused to focus at a specific region within the integrated structure for detection purposes.

BRIEF DESCRIPTION OF THE DRAWINGS

FIG. 1 is a graphic representation of the decrease in the refractive index of aluminum GaAlAs as a function of increasing Al content;

FIG. 1A is a sectional view of a waveguide using GaAlAs as a core and cladding material;

FIG. 2 is a sectional view of an integrated optic double heterostructure light source of the prior art;

FIG. 3 is a sectional view of an integrated optic double heterostructure light source according to the invention;

FIG. 4 is a sectional view of the prior art device of FIG. 2 including an optical fiber;

FIG. 5 is an end view of the device of FIG. 4;

FIG. 6 is a sectional view of the inventive device of FIG. 3 including an optical fiber;

FIGS. 8A–8C are bottom views of further embodiments of the device of FIG. 6;

FIG. 8D is a bottom view of an alternate embodiment of the device of FIG. 4 in partial section;

FIG. 8E is a cross-section of the device of FIG. 8D including an optical fiber;

FIG. 10A is a further embodiment of the device of FIG. 9 including an optical fiber;

FIG. 10B is a bottom view of a further embodiment of the device of FIG. 10A including two pairs of optical fibers;

FIG. 10C is a sectional view of an alternate embodiment of the device of FIG. 10A;

GENERAL DESCRIPTION OF THE INVENTION

Figure 7:
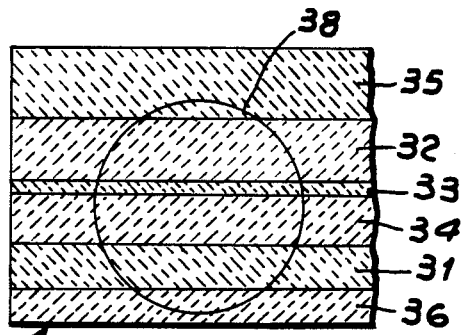
FIG. 7 is an end view of the device of FIG. 6.

FIG. 4 shows a prior art laser configuration wherein an optical fiber 10 having a core 11 and a cladding 12 is optically coupled to a double-heterostructure light emitting device 13 where the core 11 of the optical fiber 10 is aligned with the active layer 14 of the light emissive device 13. The light output profile 15 corresponding to the light emitted by the active layer 14 of the device 13, of FIG. 4 is shown in FIG. 5. It is to be noted that the active layer 14 of the device of FIGS. 4 and 5 is relatively thin in relation to the core 11 of fiber 10 and that the corresponding geometry of the light output profile 15 is also quite small. When the optical fiber 10 is coupled with the prior art device 13 of FIG. 4, the large discrepancy between the geometry of the fiber optic core 11 and the light output profile 15 causes some losses to occur as the light transfers from the light emitting device 13 into the core 11 of the fiber 10.

The index of refraction of gallium arsenide material can be conveniently controlled by varying the aluminum concentration. The index of refraction through the gallium aluminum arsenide material varies inversely in proportion to the amount of aluminum material that is substituted for the gallium. FIG. 1 shows the relationship A between the index of refraction for gallium aluminum arsenide as a function of increasing aluminum concentration.

A simplified version of a waveguide 16 consisting of gallium aluminum arsenide can be seen by reference to FIG. 1A where a first cladding layer 17 of gallium aluminum arsenide has a particular concentration of aluminum and a corresponding first value of index of refraction. The second layer 18 comprises the core and has a concentration of aluminum lower than that of the first cladding layer 17 to ensure that the light will be confined within the core 18. A second cladding layer 19 is placed over the core 18 and the concentration of aluminum in the second cladding layer 19 is purposely kept higher than the aluminum in the core to ensure that the corresponding index of refraction of the second cladding layer 19 is lower than the index of refraction of the core material.

DESCRIPTION OF THE PREFERRED EMBODIMENT

The novel features of this invention are illustrated in FIG. 3 where the substrate 36 comprises n-type gallium arsenide, the first cladding layer 31 comprises n-type gallium aluminum arsenide, the active layer 33 comprises gallium aluminum arsenide or n- or p-type gallium arsenide, the second cladding layer 32 comprises p-type gallium aluminum arsenide and the outer layer 35 comprises p-type gallium arsenide. The core layer 34 comprises p-type gallium aluminum arsenide. The concentration of aluminum in the first and second cladding layers (31, 32) is equal to or greater than the aluminum content in the core layer 34. The concentration of aluminum within the gallium aluminum arsenide material decreases continuously from the interface of the core 34 and the first cladding layer 31 to the interface between the core 34 and the active layer 33. The continuous grading in index of refraction in the core layer 34 therefore causes the light generated within the active layer 33 of the core 34 to be directed along a particular direction continuously along the waveguide 30 eventually causing the light to become collimated and arriving essentially parallel at surface 37.

The concentration gradient of aluminum will determine the corresponding index of refraction gradient such that the various types of profiles that can be achieved with optical fibers having graded indices of refraction, such as parabolic graded indices, can also be achieved by the methods of this invention.

The embodiment of FIG. 3 is shown relative to an optical fiber 10 in FIG. 6. The fiber 10 is shown having a cladding layer 12 and a light transmitting core 11. The active layer 33 and the core layer 34 are relatively large in comparison to the active region 14 of the prior art device of FIG. 4. The corresponding light output profile 38 for the structure 30 of FIG. 6 is shown in FIG. 7. The geometry of the light output profile 38 for the device of FIGS. 6 and 7 readily transfer light into the core 11 of the optical fiber 10.

By the methods of this invention, the light generated within the active region is rendered essentially parallel by the graded index of refraction and leaves the surface of the corresponding laser or light emitting diode with very little loss.

The light guiding means for confining the light transmission in the prior art device 20 is depicted in FIG. 2. The concentration of aluminum in the first and second layers (21, 22) designated as either guiding layers or as cladding layers for the purpose of this disclosure, is intentionally kept higher than in the active layer 23 in order to keep the index of refraction of the cladding layers (21, 22) lower than that of the active layer 23. Light therefore generated within the active layer 23 is successively reflected between the interfaces occurring at the cladding layers 21, 22 having the higher aluminum content.

FIG. 3 is a double heterostructure light emitting device 30 containing the graded waveguide structure according to the invention as described earlier. The embodiment of FIG. 3 includes a light emissive region called the active layer 33 relative to the integrally formed waveguide consisting of a first cladding layer 31 and a second cladding layer 32 enclosing the active light emitting layer 33 and the waveguide core 34. The outer layer 35 provides the necessary electrical properties in cooperation with the substrate 36 to make an operational double heterostructure light emitting device which depending upon construction can be either a light emitting diode or a laser. The embodiment of FIG. 3 operates in the following manner. When a forward bias is applied across the outer layer 35 and the substrate 36 electrons are injected into the active region 33 causing the emission of light to propagate into the core layer 34. In the prior art device of FIG. 2 the light generated within the active layer 23 must correspondingly travel through the material that creates the light and a substantial portion of the light is lost by the mechanism of self absorption. The spectral emissivity of the light emanating from the active layer 23 depends to a large extent on the concentration of materials constituting the active layer. In the device 30 of FIG. 6 the active region 33 and the light guiding core 34 are shown greatly enlarged in order to compare the geometry of the active and core region (33, 34) to that of an optical fiber 10 and the corresponding optical fiber core 11. Some actual dimensions existing with devices according to the invention are a core region 34 ranging from 5-10 microns and an active region 33 of 0.5 microns. An approximate value for the diameter of the core 11 of optical fiber 10 is 50 microns.

Figure 8:
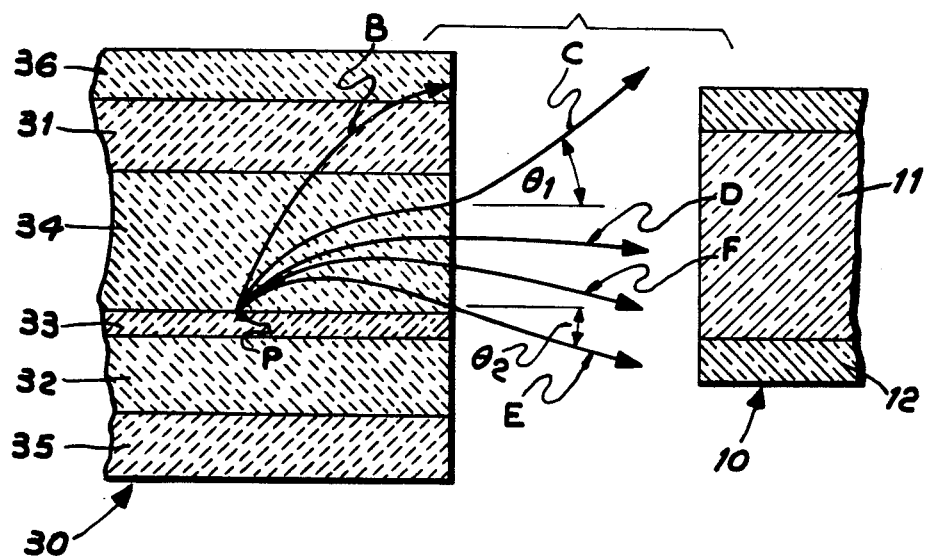
FIG. 8 is an enlarged sectional view of the embodiment of FIG. 6 including directional light ray indicators.

FIG. 8 is a graphic representation of how light generated at Point P within the active region 33 of the device 30 of FIG. 6 exits from the device 30 relative to the optical fiber 10. The light beam B traveling at a large angle through the core layer 34 enters into the first cladding layer 31 to layer 36 and is subsequently lost. Light emanating with the trajectory indicated at C leaves the surface of the light emissive device 30 at an angle $\theta_1$ greater than $\theta_a$ (where $\theta_a$ is the acceptance angle of the fiber 10) and is also lost to the system. The ray emanating having the trajectory indicated at D exits from the surface of the device 30 relatively parallel to the axis of both the core 34 of the light emitting device 30 and parallel to the axis of the core 11 of the optical fiber 10. Light emanating having the trajectory indicated by ray E and an exit angle $\theta_2$ greater than $\theta_a$ is also lost. Light exiting from the core region 34 having the trajectory F enters into the fiber core 11.

The graphic representation of FIG. 8 therefore shows that the ideal exit for light emanating from any point within the active region 33 is parallel to the axis of the core 11 so that the light will readily enter into the core 11 of the optical fiber 10 and be transmited therethrough.

Further embodiments of the device of FIG. 8 are shown in FIG. 8A, 8B and 8C. In FIG. 8A the light emitting device 70 is of a stripe geometry having a stripe electrical contact 72 and the light is coupled to the fiber 71 in the direction parallel to the junction plane and perpendicular to the direction of refractive index variation. It is an improvement over conventional stripe geometry light emitting diodes (LED) in that the light absorption is less.

FIG. 8B is another embodiment 74 of the device 70 of FIG. 8A having only a partial stripe contact 73. The length of the contact 73 is such that the distance "a" is optimized for the maximum number of light rays to reach the emitting surface at normal incidence for transmitting into optical fiber 75. FIG. 8C is a further embodiment 76 of the device 70 of FIG. 8A for coupling into a plurality of fibers 77, 78, 79, 80 or a fiber ribbon. The stripe contact 81 is perpendicular to the axis of fibers 77-80 and the distance of the stripe contact 81 is optimized for efficient light transfer into the fibers as described for the embodiment of FIG. 8B. The light emitting device 76 also includes a total reflecting coating 82 for reflecting light generated within the junction under stripe contact 81 back through the junction to the fibers (77-80).

Another embodiment of the device 70 of FIG. 8A is shown at 83 in FIG. 8D in which the light is taken in the same direction as the index variation. The device 83 is a ring contact device where the electrons are directed into a central region 84' of the active layer 84. The central area active region 84 will be absorbing to the light. However, the geometric advantage of this structure will more than compensate for the absorption in this region.

A reflecting coating 85 is applied to the perimeter of the device 83 to reflect light generated in the plane of the active region 84 in a direction perpendicular to the plane of the active region.

This is shown in greater detail in FIG. 8E where the device 83 having reflecting coating 85 around the perimeter and anti-reflection coating 86 proximate to the active layer 84. The optical fiber 87 is also shown in close proximity to anti-reflection coating 86 to receive light generated within the active layer 84 and passing through anti-reflection coating 86. For the ring contact configuration of the device 83 a first electrode 88 is applied to substrate 89 and a second ring shaped electrode 90 is applied to second cladding layer 91. The central region of the outer layer 91 is kept free of electrode material to promote transmission through the anti-reflection coating 86. The active layer 84 is located relative to the core 93 and the first cladding layer 89 and second cladding layer 91 provide waveguiding properties in the core 93 as described earlier. Light generated within active layer 84 will reflect continuously off of the reflecting coating 85, and the interface between the ring electrode 90 and second cladding layer 91. Upon passing through the graded index region of core 93 the light will bend in the direction indicated by arrows 95, 96 through anti-reflection coating 86 into optical fiber 87.

As described earlier the integrated optical structure of this invention not only incorporates a graded index waveguide region having a light emitting active region but can also contain an active region that is sensitive to light and is operable as a detector of light entering into the device.

It is to be clearly understood that the active layer 33 next to the core layer 34 of the device 30 of FIG. 3 can also be a light detecting active region so that when an optical fiber carrying light is placed against surface of the device 30 then the light entering the core layer 34 will correspondingly be caused to focus at the active light detecting layer 33.

When the integrated optical device of this invention contains an active light detection region within the core the geometric optics of the previous devices are reversed. Light entering from the optical fiber enters into the graded index region and is subsequently focused at a point on the surface of the light detection region thereby efficiently coupling the light from the fiber to the surface of the detector with very little loss in transition.

Figure 9:
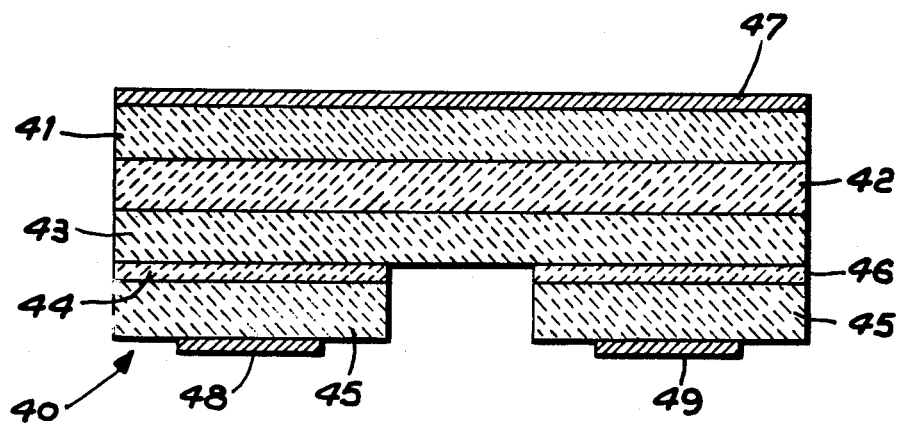
FIG. 9 is a sectional view of an alternate embodiment of the integrated optical device according to the invention.

FIG. 9 shows an integrated optical device 40 according to the invention which contains both light emitting and light detecting regions. A gallium arsenide substrate 41 is coated with a first cladding layer 42 containing gallium aluminum arsenide, a waveguide core region 43, containing gallium aluminum arsenide wherein the aluminum concentration varies as discussed in the earlier embodiments and a light emitting active region 44 relative to the waveguide core 43 and a first cladding layer 45.

A light detecting active region 46 is also contained within integrated optic structure 40 and sharing the common first cladding layer 42 on the common waveguide core 43 and having a second cladding 45' all on the same substrate 41 as light emitting active region 44. The light emitting active region 44 and the light detecting active region 46 are optically continuous by means of waveguide core 43 but are electrically discontinuous. Electrical contact is made to both active regions (44, 46) by means of electrodes (48, 49) and electrical contact is made to the substrate 41 by means of electrode 47.

For the combined light detecting and light transmitting integrated optic device 40 of FIG. 9, several embodiments are indicated respectively in FIGS. 10A-10C. FIG. 10A shows the inventive integrated optic device 50 having a light detecting layer 51 and light generating layer 52, a graded core 53, cladding 59 and electrodes 54, 55 and 56 as shown.

In this embodiment the device 50 is used as an optical modulator. The light generating layer 52 upon application of voltage $E_0$ by means of battery $V_1$, variable resistor $R_1$ and meter $E_s$ transmits light in the direction indicated by arrow T. The light rays are directed by means of the graded index core 53 into the light detecting layer 51 as indicated. The light detecting layer 51 has a separate voltage supply consisting of battery $V_2$, adjustable resistor $R_2$ and modulating voltage Em. The modulating voltage (Em) is applied between the base 50 and electrode 54. The attenuation of light upon passage through light detecting layer 51 depends upon the value of the modulating voltage Em.

The bias of the detecting section is modulated by Em, which determines the absorption coefficient of the layer 51 and the core region 53 above 51 through the Franz-Keldysh effect, which is the shifting of the absorption band by means of an electric field.

When the value of the modulating voltage Em is adjusted to produce low absorption within layer 51 the light generated within layer 52 readily transmits into fiber 10 as indicated by arrow T. The integrated optic structure of the device 50 can therefore produce and modulate light by means of common graded core 53, and independent light generating and detecting layers 52, 51 without complex additional circuitry.

An alternate embodiment of FIG. 10A is shown in FIG. 10B where a single light emitting source is modulated by multiple modulators to supply separate fibers at the same time. In the device 100 of FIG. 10B 4 modulators (101, 102, 103, 104) are formed into a common graded core structure 105 by electrically isolating 4 light detecting regions similar to the light detecting layer 51 of the device of FIG. 10A. A common light souce 106 is formed by means of a light generating layer similar to layer 52 of the aforementioned device of FIG. 10A. Four corresponding optical fibers, 107, 108, 109 and 110 are respectively located proximate modulators 101, 102, 103 and 104 so that each modulator can individually modulate light generated by common light source 106 into each respective optical fiber. Although only 4 fibers are shown optically coupled to 4 corresponding modulators this is by example only since a large plurality of light sources and modulators can be formed in a single device by the method of this invention.

FIG. 10C contains a single integrated optic device 60 having a pair of optical fibers 10, 10' at each end. The active light detecting layer 61 and light generating layer 62 are connected by common graded core layer 63. The cladding layers are 69, 68 and 67 as shown. Electrical connection to device 60 is made by electrodes 64, 65 and 66 as shown. In this embodiment light entering from optical fiber 10 is directed by graded core 63 into the detection layer 61. This is shown by indicating arrow R. The light generated within the light generating layer 62 is directed by means of graded core layer 63 into optical fiber 10'. This is shown by indicating arrow T. Thus, it is readily apparent from the integrated device of FIG. 10C that optical communication can be sent out on one fiber 10' and optical communication can be received from another fiber 10 by the same integrated optic structure 60. The detected signal $V_D$ can also be amplified and pulse shape restored and then applied as Em to the light emitting section. In this way, the unit acts as a part of a fiber-optic repeater. When the device 60 of FIG. 10C is used as an optical repeater, an incoming light signal from a first optical fiber 10 as indicated by arrow R generates a signal at $V_D$ across resistor R. The signal $V_D$ is then amplified and regenerated before applying to Vm across electrodes 65 and 66 to cause light generating layer 62 to emit into fiber 10' light as indicated by arrow T.

Figure 11A:
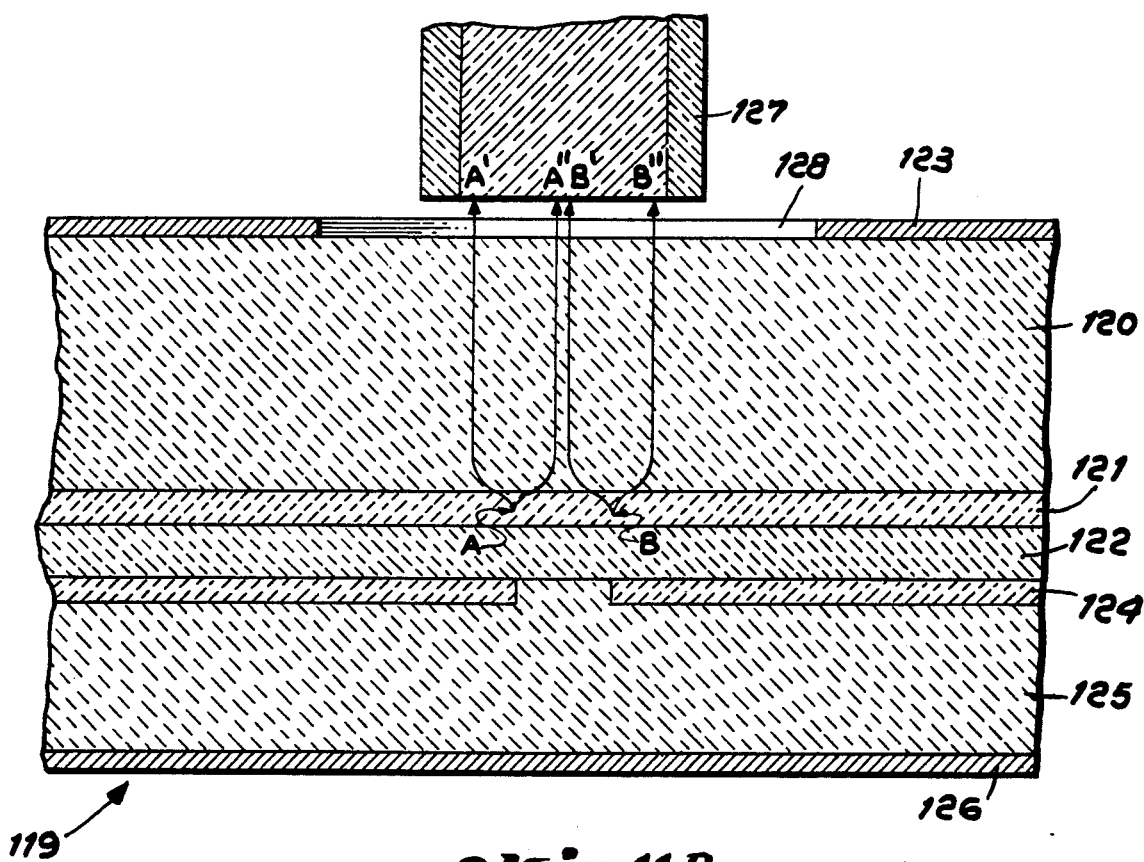
FIG. 11A is a sectional view of an alternate embodiment of the device of FIG. 10C.

Another method of using the graded index provided by the varying amount of A1 in the GaA1As layer to collimate light is shown in FIG. 11A.

The light is received in device 119 in the same direction as the refractive index variation. The refractive index is lower at the active layer 121—core 120 interface than at the interface between the core 120 and the contact layer 123. The A1 content of the core layer 120 on top of the active layer 121 is graded in such a way that the A1 concentration is highest next to the active layer 121 and decreases monotonically away from the active layer 121. This results in an index profile which increases with distance away from the active layer 121. As a result, light emitted from the active layer 121 tends to be collimated as it passes through the graded index core region 120 and provides better coupling efficiency to the fiber 127.

In this embodiment a ring contact device is provided by applying the graded core layer 120, active layer 121, cladding layer 122 and p-type current blocking layer 124 to substrate 125. The current is caused to transport through on narrow regions of the active layer 121 by means of a potential applied to electrical contact 126 and circular electrode 123 as shown. To facilitate optical transfer from the device 119 the optical fiber 127 is brought into close proximity with the exposed region 128 of the graded core 120 within circular electrode 123. The light transfer pattern of light rays propagating at points A and B within active layer 121 is indicated by arrows A', A" and B', B". In this application of graded core devices light originating within any part of the active layer 121 will become collimated into parallel rays upon transmission through the graded refractive index of the core 120.

Figure 11B:
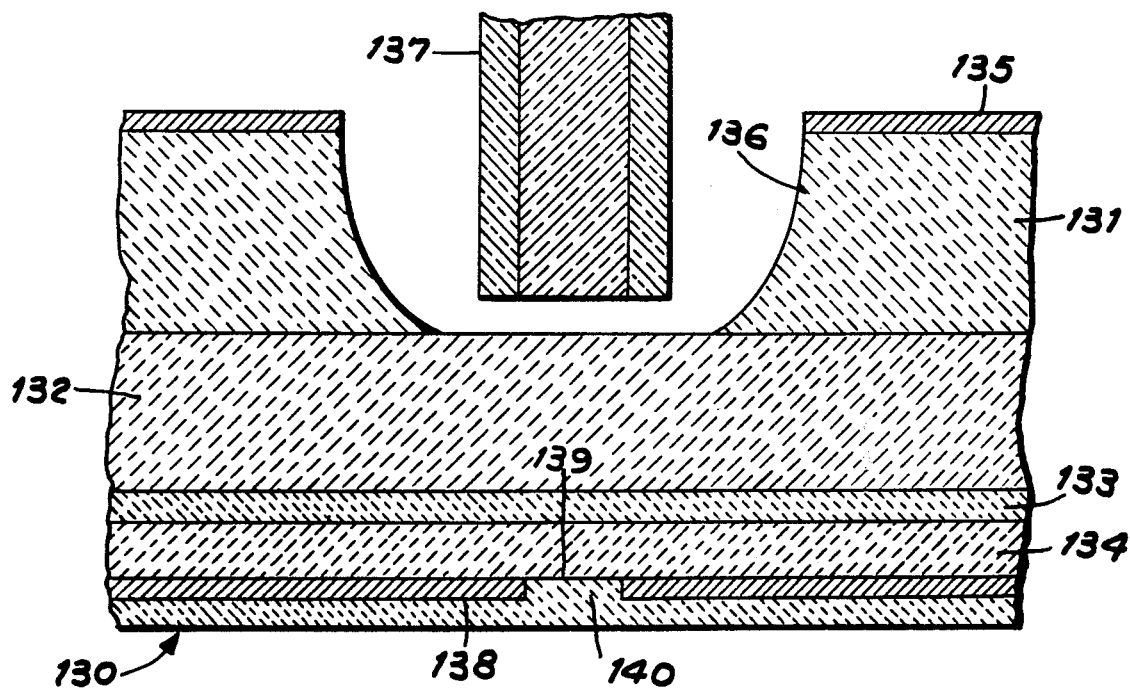
FIG. 11B is a sectional view of a further embodiment of the device of FIG. 10C.

FIG. 11B is an alternate embodiment of FIG. 11A. The difference between the device 119 of FIG. 11A and the device 130 of FIG. 11B lies in the side of the device used for light extraction. Light is taken out from the substrate side of device 130 instead of the p layer side of the device of FIG. 11A. Special etching procedures are required for the device 130 of FIG. 11B to remove the substrate 131 but not etch any of the graded GaA1As layer 132.

The device 130 of FIG. 11B also contains an active layer 133, cladding layer 134 and circular electrode 135 as described earlier for the device 119 of FIG. 11A. To facilitate the etching of the cavity 136 for inserting optical fiber 137 a silica layer 138 is first coated over cladding 134. An opening 139 is etched through the silica layer 138 and a p contact layer 140 is applied over the silica layer 138 to provide electrical continuity with active layer 133. The core layer 132 in FIG. 11b is similar to the core layer 120 in FIG. 11a, i.e., the index of refraction varies the same way from the active layer to the top surface of the core layer.

In addition, the A1 content of the cladding layer may be varied to produce a graded refractive index profile. The graded index aids in focusing the emitted light by collimating it into parallel rays. This is particularly useful where light emitted from a LED or laser is taken out in a normal direction as opposed to being guided.

Although the integrated optic structure of this invention is shown for optical communication purposes this is by way of example only. The novel features of this invention find application wherever directed light for generating and detecting purposes may be required.

The implementation of a graded index waveguide to integrated optic structures allows for the controlled direction of light within the structure of the device. This optical direction and confinement property allows a plurality of light active-regions that are sensitized for the detection or for the generation of light to be contained within a common substrate so that any possible number of light transmitting and light detecting elements can be optically combined for multi-funtional purposes. I claim:

1. A double heterostructure light emitting device comprising:
   a substrate layer of GaAs;
   a first layer of GaA1As on the GaAs substrate the Ga concentration increasing continually outward from said GaAs substrate and the A1 concentration decreasing continuously outward from the GaAs substrate;
   an active layer of GaA1As on the first GaA1As layer for generating light;
   a second GaA1As layer on the active layer; and
   a third GaA1As layer on the second GaA1As layer.

2. The device of claim 1 wherein the Ga comprises 0.95 and the Al comprises 0.05.

3. The device of claim 1 wherein the active layer comprises n-type GaAs,

4. The device of claim 1 wherein the active layer comprises p-type GaAs.

5. The device of claim 2 wherein the Al in th p-type GaAlAs ranges from 0.1 to 0.3.

6. The device of claim 1 wherein the active layer comprises a thickness of from 0.1 to 5 microns;

7. The device of claim 1 wherein the n-type GaAlAs comprises a thickness of from 5 to 30 microns.

8. The device of claim 1 wherein the aluminum concentration in the n-type GaAlAs layer on the substrate varies quadratically with the distance from the substrate layer.

9. The device of claim 1 wherein light entering the n-type GaAlAs layer on the substrate is focused at one surface of the n-type GaAlAs in a plane perpendicular to the n-type GaAlAs layer.

10. A heterostructure graded index waveguide device comprising:
- a first cladding layer having a first composition of gallium aluminum arsenide;
- a core layer on said first cladding layer, said core comprising gallium aluminum arsenide having a higher index of refraction than said first gallium aluminum arsenide; and
- a second cladding layer having a second concentration of gallium aluminum arsenide wherein the index of refraction of the core region is greater than the index of refraction of the first and second cladding layers, and wherein the concentration of aluminum within the core increases progressively from the first cladding layer to the second cladding layer to cause a corresponding gradient in refractive index within the core.

11. The heterostructure device of claim 10 wherein the gallium aluminum arsenide concentration varies in aluminum content outwardly from the core within the second cladding layer.

12. The heterostructure device of claim 11 wherein the concentration of aluminum in the second cladding layer continuously increases outwardly from the core.

13. The heterostructure device of claim 10 wherein the concentration of aluminum in the first and second cladding layers is equal.

14. The heterostructure device of claim 10 wherein the concentration of aluminum in the first cladding layer is less than the concentration of aluminum in the second cladding layer.

15. A double heterostructure integrated optic device comprising;
- an n-type gallium arsenide substrate layer;
- a first cladding layer of n-type gallium aluminum arsenide material having a first aluminum concentration and a correspoding first index of refraction;
- a core layer having first and second surfaces and consisting of n-type gallium aluminum arsenide wherein the aluminum concentration decreasingly varies from said first surface to said second surface.
- a second cladding layer of p-type gallium aluminum arsenide on the second surface of the core layer having a second aluminum concentration and a second index of refraction said second index of refraction being lower than the index of refraction of the core layer; and
- an active region of p-type gallium aluminum arsenide within said core, having a lower aluminum concentration than said first and second cladding layers.

16. The device of claim 15 wherein said active region is light emissive.

17. The device of claim 15 wherein said active region is light detecting.

18. The device of claim 15 wherein the active region contains at least one layer that is light emissive and at least one layer that is light detecting.

19. A double heterostructure integrated optic device comprising:
- a GaAs substrate layer;
- a first cladding layer of GaAlAs having a first index of refraction on the substrate;
- a core layer of GaAlAs having a higher index of refraction than the first index;
- a second cladding layer of GaAlAs on the core having first and second surfaces wherein the concentration of Al increases from said first to said second surface to cause a corresponding decrease in refractive index within said second cladding layer; and
- at least one active region of GaAlAs on said core for propagating light within said core.

20. A double heterostructure integrated optic device comprising:
- a GaAs substrate layer;
- a first cladding layer of GaAlAs having a first index of refraction on the substrate; and
- an active layer of GaAlAs having a higher index of refraction than the first index;
- a core layer of GaAlAs on the active layer having first and second surfaces wherein the concentration of Al decreases from said first to said
- second surface to cause a corresponding increase in refractive index within said core layer.

* * * * *